(12) United States Patent
Ren

(10) Patent No.: US 8,901,977 B1
(45) Date of Patent: Dec. 2, 2014

(54) FEEDBACK FOR DELAY LOCK LOOP

(71) Applicant: Inphi Corporation, Santa Clara, CA (US)

(72) Inventor: Guojun Ren, San Jose, CA (US)

(73) Assignee: Inphi Corporation, Santa Clara, CA (US)

( * ) Notice: Subject to any disclaimer, the term of this patent is extended or adjusted under 35 U.S.C. 154(b) by 0 days.

(21) Appl. No.: 14/321,602

(22) Filed: Jul. 1, 2014

(51) Int. Cl.
*H03L 7/06* (2006.01)
*H03L 7/08* (2006.01)

(52) U.S. Cl.
CPC .......................................... *H03L 7/08* (2013.01)
USPC .......................................... 327/157; 327/148

(58) Field of Classification Search
USPC ................................................. 327/148, 157
See application file for complete search history.

(56) References Cited

U.S. PATENT DOCUMENTS

| | | | |
|---|---|---|---|
| 7,372,339 B2 * | 5/2008 | Fu | 331/16 |
| 8,076,962 B2 * | 12/2011 | Chen et al. | 327/157 |
| 8,415,998 B2 * | 4/2013 | Tabata | 327/156 |
| 2005/0168292 A1 * | 8/2005 | Frans et al. | 331/16 |
| 2010/0141311 A1 * | 6/2010 | Kim et al. | 327/157 |
| 2011/0285438 A1 * | 11/2011 | Kinugasa et al. | 327/157 |
| 2014/0084976 A1 * | 3/2014 | Maneatis et al. | 327/157 |

* cited by examiner

*Primary Examiner* — Adam Houston
(74) *Attorney, Agent, or Firm* — Richard T. Ogawa; Ogawa P.C.

(57) ABSTRACT

The present invention is directed to signal processing system and electrical circuits. More specifically, embodiments of the present invention provide a DLL system that provides phase correction by determining a system offset based on phase differences among the delay lines. The offset is used as a part of a feedback loop to provide phase corrections for the delay lines. There are other embodiments as well.

20 Claims, 9 Drawing Sheets

FEEDBACK FOR DELAY LOCK LOOP

CROSS-REFERENCES TO RELATED APPLICATIONS

Not Applicable

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed to signal processing system and electrical circuits.

Over the last few decades, we have witness a continued increase in processing power and speed of computing device and electronics. Machines are expected to perform a large number of operations quickly. Similarly, data are transferred at higher and higher speed. An important aspect of operating electronic devices and communication systems, especially in the digital domain, is to provide reference clock signal that provide coordination of various circuits. Without accurate and reliable clock signals, high speed computation and communication are not possible.

With complicated ICs operating at high speeds, it is important to provide mechanism to lock clock signals. Over the past, phase-locked loop (PLL) and delay-locked loop (DLL) have been used to provide synchronization. DLL systems are implemented using delay lines, as opposed to oscillator in PLL systems.

In addition to provide synchronization, DLL systems have also been used to change phase of a clock signal, provide clock recovery, deskew, and in many other applications. Over the past, various types of DLL systems have been proposed and implemented. Unfortunately, existing DLL systems are often inadequate, especially in high speed operation. Therefore, new and improved DLL systems are desired.

BRIEF SUMMARY OF THE INVENTION

The present invention is directed to signal processing system and electrical circuits. More specifically, embodiments of the present invention provide a DLL system that provides phase correction by determining a system offset based on phase differences among the delay lines. The offset is used as a part of a feedback loop to provide phase corrections for the delay lines. There are other embodiments as well.

According to an embodiment, the present invention provides a delay-lock loop system. The system includes a phase detector configured to generate an up signal and a down signal based on a reference clock signal and a feedback clock signal. The system also includes a charge pump. The charge pump is configured to generate a reference voltage using the up signal and the down signal from the phase detection. The system further includes a voltage regulator that is configured to generate a drive voltage based on the reference voltage. The system additionally includes a delay module having N delay lines that include a first delay line $D_0$ and a last delay line $D_{n-1}$.

The delay module is configured to provide a positive current compensation value and a negative current compensation value using a first common feedback structure. The first common feedback structure has a first input based on the phase difference between the first delay line $D_0$ and the last delay line $D_{n-1}$ and a second input based on two adjacent delay lines of the N delay lines.

According to another embodiment, the present invention provides delay lock loop circuit. The circuit includes a phase detector configured to generate an up signal and a down signal based on a first clock signal and a second clock signal. The circuit also includes charge pump that is configured to generate a reference voltage using the up signal and the down signal from the phase detection. The circuit further includes a voltage regulator generate a drive voltage based on the reference voltage. The circuit has a delay module that has N delay lines. The delay module is configured to process the drive voltage and a reference clock signal. The N delay lines has a first delay line $D_0$, a second delay line $D_1$, and a last delay line $D_{n-1}$. The first delay line is used for providing first clock signal. The circuit also includes a correction module that is configured to determine at least an offset value based on a first difference between the first delay line $D_0$ and the last delay line $D_{n-1}$ and a second difference based on two adjacent delay lines.

According to another embodiment, the present invention provides a delay lock loop method. The method includes receiving a first clock signal and a second clock signal. The method also includes generating an up signal and a down signal using the first clock signal and the second clock signal by a phase detector. The method additionally includes generating a drive signal by a charge pump. The method also includes generating N delay signals by a delay module having a plurality of delay lines using at least the drive signal. Each of the delay signal is associated with a phase of $2\pi/n$, the N delay lines having a first delay line $D_0$ and a last delay line $D_{n-1}$. The method additionally includes determining a first offset value between the first delay line $D_0$ and a last delay line $D_{n-1}$. The method further includes determining a second offset value between two adjacent delay lines. The method includes determining a system offset value using the first offset value and the second offset value. Moreover, the method includes modifying the drive signal using the system offset value.

It is to be appreciated that embodiments of the present invention provides numerous advantages over existing technologies. For example, the offset correction techniques can vastly improve DLL performance and be conveniently implemented. According to certain embodiments, the offset correction system can be implemented in conjunction with existing DLL designs. Additionally, the offset correction mechanisms according to the embodiments of the present invention are compatible with existing and future devices and processes. For example, the offset correction mechanisms can be implemented using existing NAND, XOR, and/or other types of logics and circuits. Furthermore, embodiments of the present invention can be used for high-speed applications, such as communication, computing, and/or other types of applications. There are other benefits as well.

DETAILED DESCRIPTION OF THE INVENTION

Figure 1:
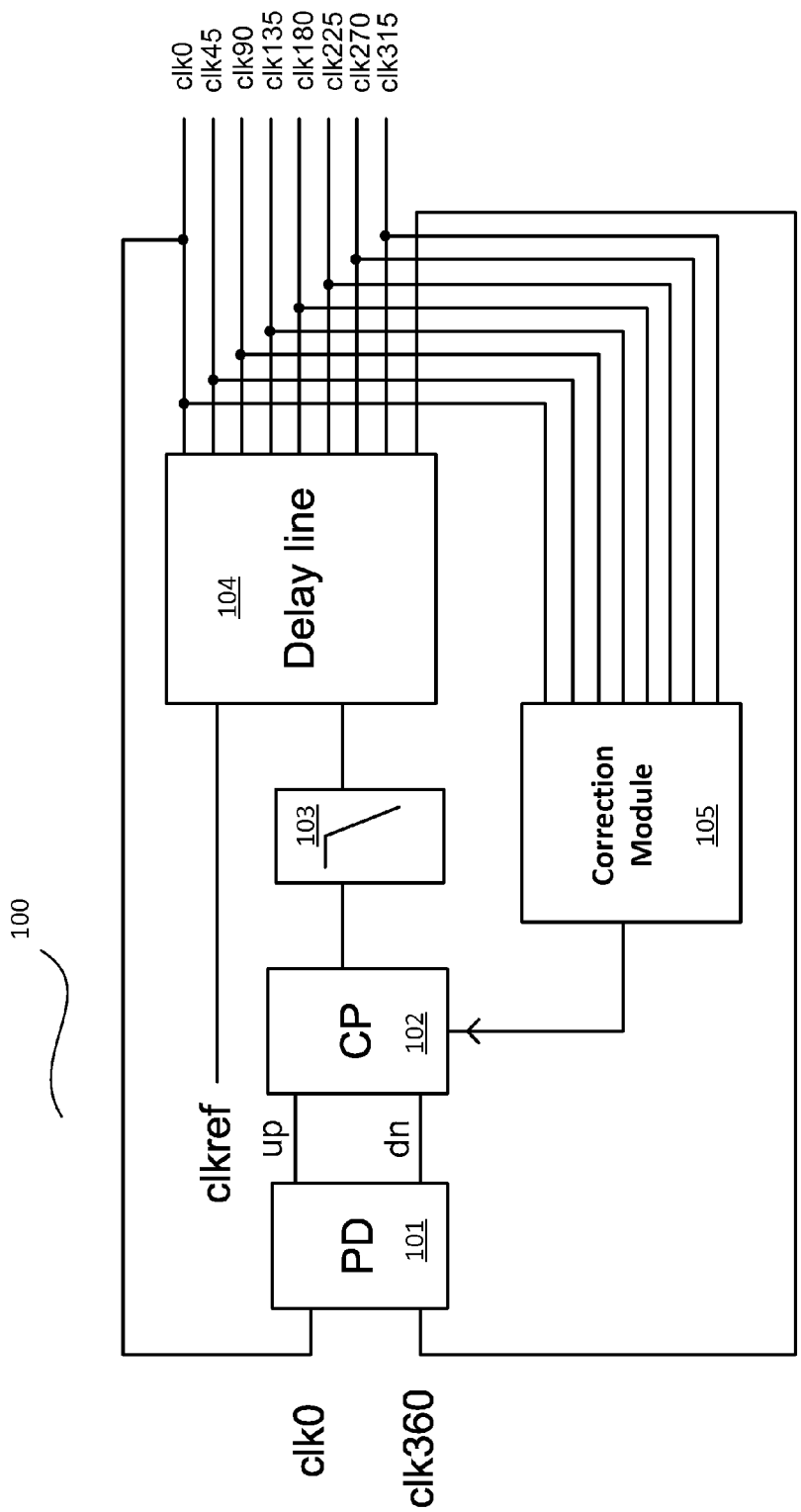
FIG. 1 is a simplified diagram illustrating a DLL system according to an embodiment of the present invention.

The present invention is directed to signal processing system and electrical circuits. More specifically, embodiments of the present invention provide a DLL system that provides phase correction by determining a system offset based on phase differences among the delay lines. The offset is used as a part of a feedback loop to provide phase corrections for the delay lines. There are other embodiments as well.

As explained above, DLL systems have many important applications. Among other things, DLL systems can operate at high speed, which can be used for high speed data communication, signal processing, computing, and other demanding applications. For example, the DLL systems and methods thereof implemented according to the present invention can operate at a clock frequency of over 1 GHz. As an example, a DLL can be used to change the phase of a clock signal, usually to enhance the clock rise-to-data output valid timing characteristics of ICs. To enhance clock signals, DLL systems themselves need to be accurate.

DLL systems are implemented with a plurality of delay lines. More specifically, the main component of a DLL system is a delay chain composed of many delay gates connected front-to-back. The input of the chain (and thus of the DLL) is connected to the clock that is to be negatively delayed. A multiplexer is connected to each stage of the delay chain; the selector of this multiplexer is automatically updated by a control circuit to produce the negative delay effect. The output of the DLL is the resulting, negatively delayed clock signal. From the outside, a DLL can be seen as a negative-delay gate placed in the clock path of a digital circuit. For example, a DLL system may have 2, 4, 8, or other numbers of delay lines (e.g., implemented using delay lines) that are serially connected. As a result, offset of delay lines would add to one another to cause a large offset for the DLL system. Over the past, conventional DLL systems use mechanisms that compensate or "balance" the delay lines one at a time. Unfortunately, conventional mechanisms are often costly to implemented and ineffective. Having one or more compensation mechanisms for each of the delay lines translate to highly complex and thus expensive circuits.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

A main component of a DLL is a delay chain composed of many delay gates connected front-to-back. The input of the chain (and thus of the DLL) is connected to the clock that is to be negatively delayed. A multiplexer is connected to each stage of the delay chain; the selector of this multiplexer is automatically updated by a control circuit to produce the negative delay effect. The output of the DLL is the resulting, negatively delayed clock signal. For many applications, the ideal outputs of the delay chain substantially evenly delayed (or spaced) clock signals. Due to inherent inconsistency within DLL circuits and operations thereof, delay line outputs are often bundled with undesirable offsets. In various embodiments, the present invention provides correction mechanisms and methods for DLL systems. For example, conventional methods involve calibrating and adjust each of delay lines, which is time consuming and greatly increases circuit complexity. In contrast, embodiments of the present invention are relatively simple to implement.

FIG. 1 is a simplified diagram illustrating a DLL system according to an embodiment of the present invention. This diagram is merely an example, which should not unduly limit the scope of the claims. One of ordinary skill in the art would recognize many variations, alternatives, and modifications. As shown in FIG. 1, a delay lock loop system includes a phase detector 101. As shown, the phase detector 101 is configured to generate an up signal and a down signal. As a part of the feedback system, the phase detector 101 receives clock signals clk0 and clk360 from the delay line module 104. For example, the clock signal clk0 is a feedback clock signal from the delay module 104, and the clk360 is a reference clock signal. The up signal (or upper switch signal) and the down signal (or lower switch signal) are provided by the phase detector 101. The charge pump 102 receives the up and down signal from the phase detector 101. Among other things, the charge pump 102 is configured for charging or discharging according to the up and/or down signal, and outputting a control voltage feeding into the voltage regulator 103. For example, the voltage regulator 103 comprises a capacitor, which may function as an integrator for the control voltage from the charge pump 102. The voltage regulator 103 provides a drive voltage to the delay module 104. The delay module 104 includes N delay lines. It is to be appreciated that N is typically an even number, and depending on the application, N can be 2, 4, 6, 8, etc. As an example, the delay module 104 shown in FIG. 1 has 8 delay lines, each of the delay line is associated with $2\pi/N$ (or in this case in FIG. 1, N=8) phases, or 360/8=45 degrees. As an example, a first delay line $D_0$ is associated with clock signal clk0, which is provided to the phase detector 101 as an input signal. Similarly, the second delay line $D_1$ is associated with clock signal clk45, which is 360/8=45 degrees off from clk0. The last delay line $D_7$ is 315 degrees off the first delay line $D_0$.

In actual implementations, due to physical differences and other factors associated with the delay lines, the offset among the delay lines do not line up according to the formula of $2\pi/N$, and as a result, the outputs of the delay module becomes inaccurate. For example, the delay lines are arranged in series, where each of the delay lines adds a predetermined amount of phase delay (e.g., $2\pi/N$) to the system. As a result, unintended delay offsets associated with the delay lines are compounded. With accumulated offsets from previous delay lines $D_0$ to $D_{n-2}$, the last delay line $D_{n-1}$ has a large offset, which is undesirable. For example, if each delay line causes a delay of $t_{delay}$, at $D_{n-1}$ the output signal will have a delay of about $N*t_{delay}$, which can be detrimental to the operation of the DLL system 100.

To address the offset problem associated with the delay lines, a correction module 105 is provided. Among other features, the correction module 105 is configured to determine a system offset value associated with the delay module 104. As shown in FIG. 1, the correction module 105 is coupled to the output of the delay module 104. To determine the system offset associated with the delay module 104, outputs of multiple delay lines are required. In a specific implementation, the system offset value is based on the first delay line $D_0$ (e.g., clk0), the second delay line $D_1$ (e.g., clk45), and the last delay line $D_{n-1}$ (e.g., clk315). For example, the correction module 105 determines a first between the first delay line $D_0$ and the second delay line $D_1$ to determine an offset that is specific to individual delay lines. The correction module 105 further determines an offset between the offset of the last delay line $D_{n-1}$ and the first delay line $D_0$, which are adjacent to each other. It is to be noted that since the last delay line $D_{n-1}$ is at the end of a complete phase cycle, $D_{n-1}$ signal at the first cycle is adjacent to $D_0$ at the second cycle. For example, the offset between the $D_{n-1}$ and $D_0$ is substantially related to the compounded offset value. The correction module 105 uses these two offset values to determine a system offset value. The system offset value is then used to provide an offset correction. In FIG. 1, the output of the correction module 105 is provided to the charge pump 102, but it is understood that the offset correction can be provided to other components of the DLL feedback loop. For example, the correction offset determined by the correction module 105 can be provided to the voltage regulator 103 and/or the delay module 104.

Figure 2:
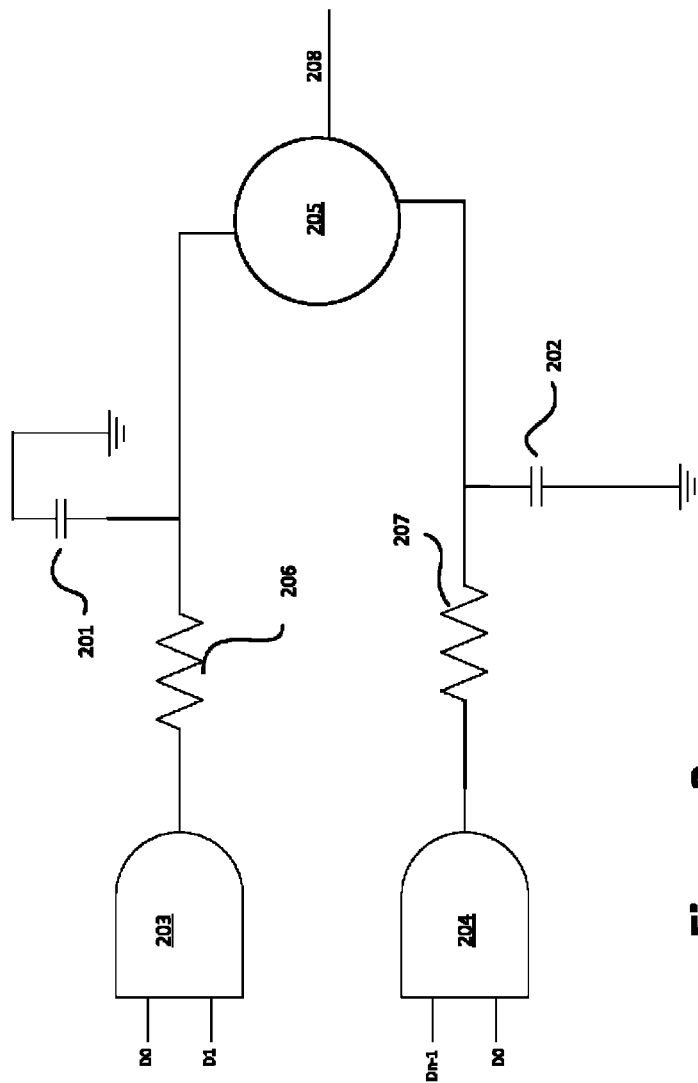
FIG. 2 is a simplified diagram illustrating a correction module according to an embodiment of the present invention.

FIG. 2 is a simplified diagram illustrating a correction module according to an embodiment of the present invention. This diagram is merely an example, which should not unduly limit the scope of the claims. One of ordinary skill in the art would recognize many variations, alternatives, and modifications. As shown in FIG. 2, a first offset value is determined between the first delay line $D_0$ and the second delay line $D_1$, by a logic gate 203. For example, the logic gate 203 as shown is an AND gate, which output an "on" signal when both the first delay line $D_0$ and the second delay line $D_1$ are on. A second offset value is determined between the first delay line $D_0$ and the last delay line $D_{n-1}$, by a logic gate 204. Similar to the logic gate 203, the logic gate 204 is also an AND gate, which output an "on" signal when both the first delay line $D_0$ and the last delay line $D_{n-1}$ are on. As explained above, system offset or system correction value is a function of the first offset and the second offset. In various implementations, the logic element 205 determines a difference between the first offset and the second offset, and the result is provided at the output 208. It is to be understood that depending on the implementation, other logic elements can be used to implement the correction system for determining the system correction value. The resistor 206 and the filter 201 are used to hold the output for of the logic 203. Similarly, the resistor 207 and filter 202 are used to hold the output for the logic gate 204. For example, the filter 201 is a low pass filter and is implemented by a capacitor.

Figure 3:
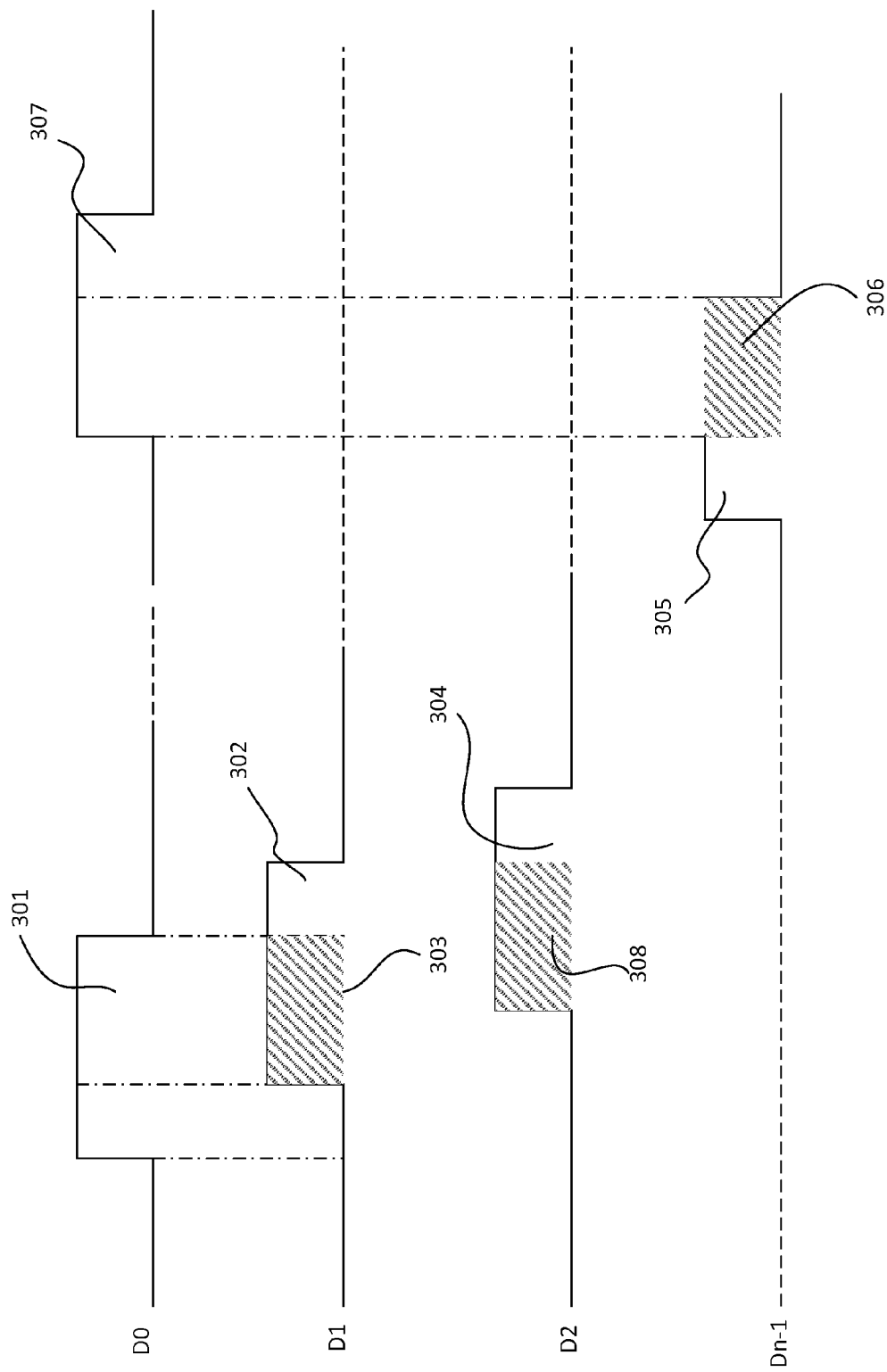
FIG. 3 is a simplified waveform diagram illustrating a process for determining a system offset according to embodiments of the present invention.

FIG. 3 is a simplified waveform diagram illustrating a process for determining a system offset according to embodiments of the present invention. This diagram is merely an example, which should not unduly limit the scope of the claims. One of ordinary skill in the art would recognize many variations, alternatives, and modifications. In FIG. 4, waveform outputs of delay nodes D0, D1, D2, and $D_{n-1}$ are shown, and it is understood that, as explained above, there can be any number of delay nodes and their respective waveform outputs. For example, when the total number of the delay node is n=4, there are four outputs, D0, D1, D2, and D3, each having a phase of 90 degrees. For example, a delay module (or sometimes referred to as delay line) has a total delay that is locked to a clock period.

To detect errors, the output of the first delay node D0 and the output of the last delay node $D_{n-1}$ are process. For example, the delay node $D_{n-1}$ is on at 305 during a first clock cycle. The delay node D0 is on at 307 during a second clock. The desired output, without system errors, is to have no overlap between 305 and 307. However, as shown in FIG. 3, 305 and 307 has an overlap 306, which is likely to be a result of an accumulate offset from all of the delay nodes during a clock cycle. The overlap 306 is used to determine a system offset caused by the delay module.

As with other types of electrical components, there are interferences and noises during operation, and is it no exception with DLL circuits. For example, offset between adjacent delay nodes are likely to be caused by such interferences and noises. In FIG. 3, D0 is on at 301, and D1 is on during 302. Since D0 are D1 are separated by their respective phases, there should be no overlap. However, as shown in FIG. 3, 301 and 032 overlap each other during 303. Similarly, 302 and 304 overlap each other during 308. Overlaps 303 and/or 308 can thus be used to detect system noise errors. It is to be understood that depending on the specific application any two adjacent delay nodes can be used for determining system noise errors. As explained above and illustrated in FIG. 2, the AND gate 204 would have an output of 306, which is the undesirable overlap between D0 and $D_{n-1}$, indicating a delay module error. The AND gate 203 would have an output of 303, which is the desirable overlap between D0 and D1, indicating a system noise error. It is to be appreciated that depending on the implementations, different combinations of delay node outputs can be used.

Figure 4A:
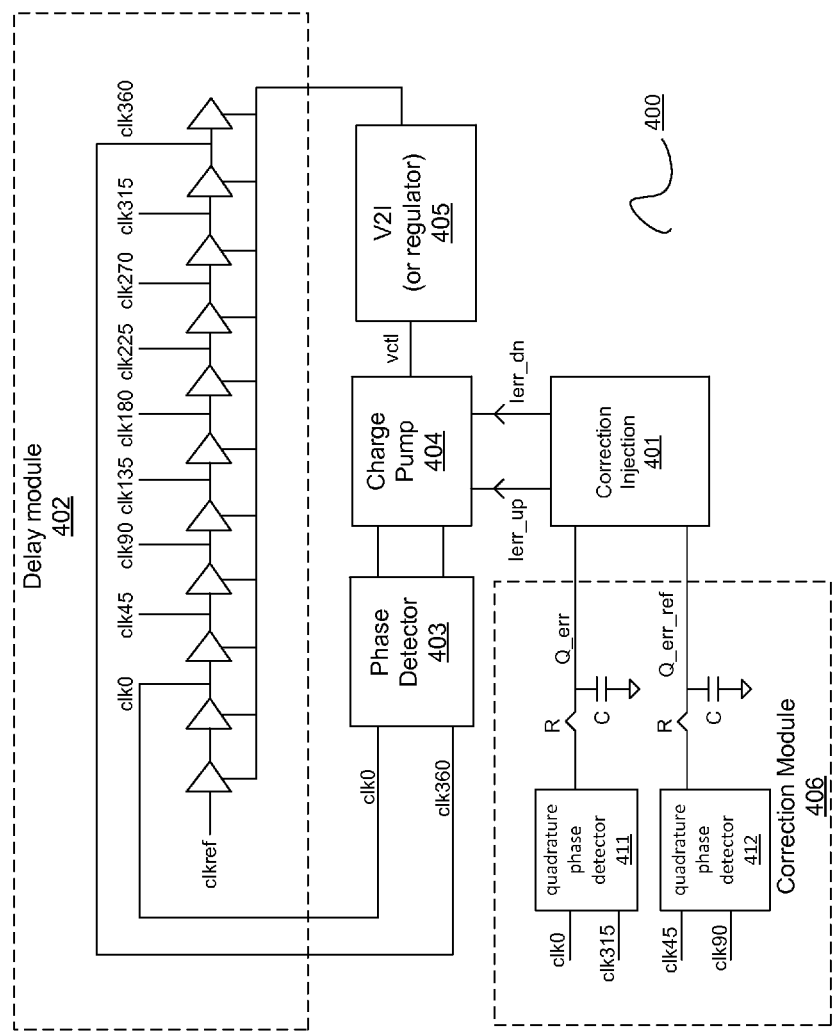
FIG. 4A is a simplified diagram illustrating a DLL system according to an embodiment of the present invention.

FIG. 4A is a simplified diagram illustrating a DLL system according to an embodiment of the present invention. This diagram is merely an example, which should not unduly limit the scope of the claims. One of ordinary skill in the art would recognize many variations, alternatives, and modifications. A DLL system 400 includes a phase detector 403, a charge pump 404, a voltage regulator 405, a delay line 402, a correction module 406, and a correction injection module 401. As an example, the delay module 402 includes eight delay nodes. A clock cycle, going into the delay module 402 is divided into eight phases, with each having a phase of 45 degrees (360/8). The correction module 406 receives clock signals from delay nodes of the delay module 402. The correction module 405 generates error compensation signals "Q_err" and "Q_err_ref". For example, the Q_err signal compensates delay associated with the delay module 402, as explained above, using signals clk0 and clk315, which are respectively signals from the first delay node and the last delay node. Additionally, the correction module 406 generates the Q_err_ref signal that is associated with system noises, which are determined using two adjacent delay nodes. As an example, signals clk45 and clk90 are used for generating the Q_err_ref, but it is to be understood that adjacent delay nodes can be used as well (e.g., clk90 and clk135, etc.). In various implements, the correction module 406 can be implemented using AND or XOR logic gates. In a specific embodiment, the correction module and other components of the DLL 400 are manufacturing using a 40 nm process. It is to be appreciated that other manufacturing processes are possible as well. Using the error compensation signals, the correction injection module 401 generates an up correction signal and a down correction signal that are to be injected into the charge pump 404. In various implementations, the charge pump 404 is specifically configured to generate a signal "vctl" for the voltage regulator 405, using both up signal and down signal from the phase detector 403, and the up correction signal and down correction signal from the correction injection module 401.

Figure 4B:
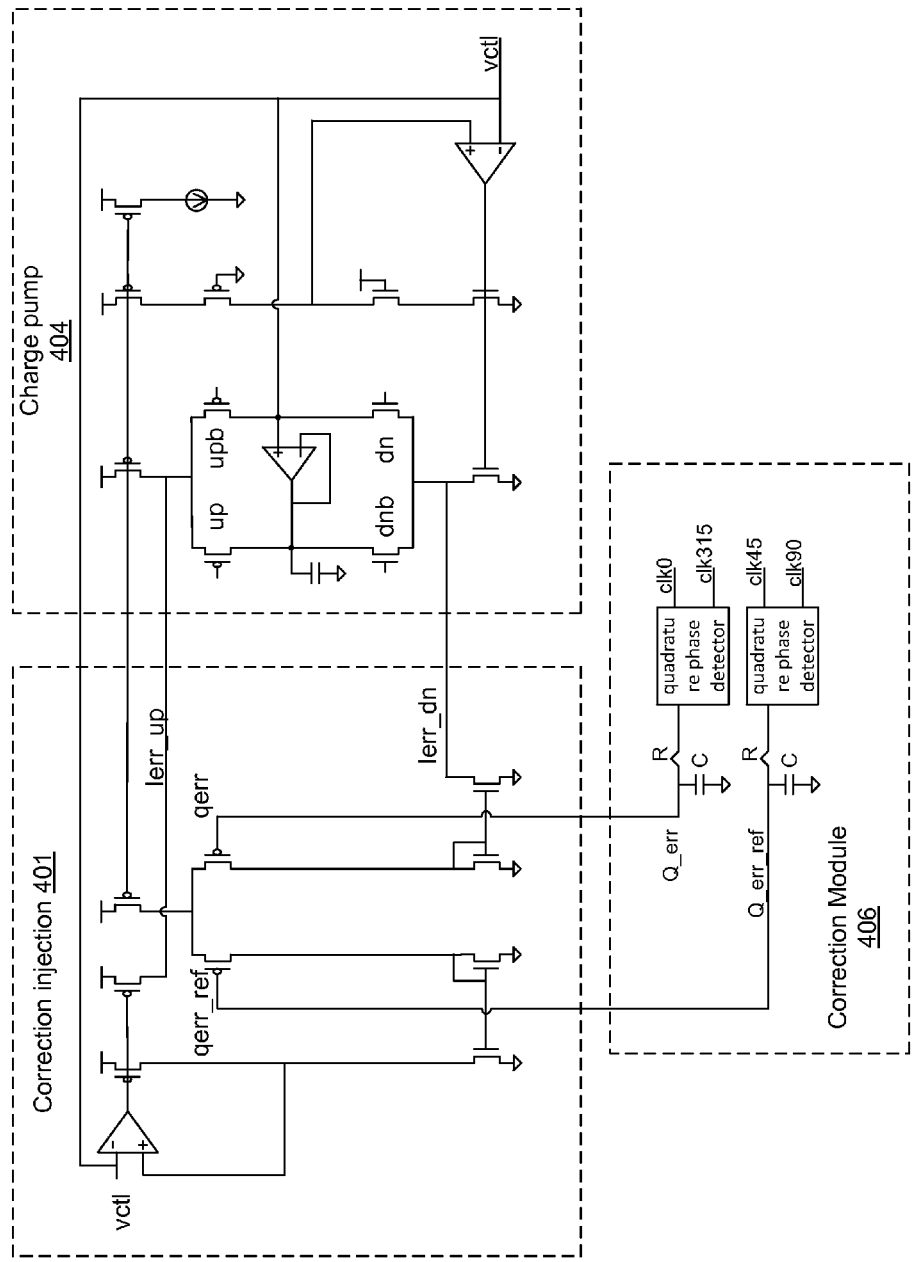
FIG. 4B is a simplified diagram illustrating circuits for generating DLL correction signals according to an embodiment of the present invention.

FIG. 4B is a simplified diagram illustrating circuits for generating DLL correction signals according to an embodiment of the present invention. This diagram is merely an example, which should not unduly limit the scope of the claims. One of ordinary skill in the art would recognize many variations, alternatives, and modifications. FIG. 4B shows circuits for the correction injection module 401 and the charge pump 404. For example, the correction injection module 401, implemented with MOS gates, generates up correction signal "$I_{err\_up}$" and down correction signal "$I_{error\_dn}$" based on the signals "Q_err" and "Q_err_ref" from the error correction module 406. For example, the up correction signal and down correction signals are current signals that charge pump 404 uses to generate the control signal vctl used by the voltage regulator. It is to be appreciated that depending on the implement of the charge pump 404 circuit, the correction injection module 401 can be modified according to provide correction signals.

It is to be appreciated that, depending on the implementation, correction signals can be injected in different ways. As mentioned above, the error correction signals can be injected to regulator (e.g., regulator 103 in FIG. 1 or regulator 405). The input of the regulator is the voltage control signal "vctl". To provide a correction signal for the regulator, the correction injection module 401 would need to process the error signals from the correction module 406 and generate a voltage correction signal. There can be other variations as well. For example, the error correction signals can be injected at various stages or components of the DLL system according to embodiments of the present invention.

Figure 5:
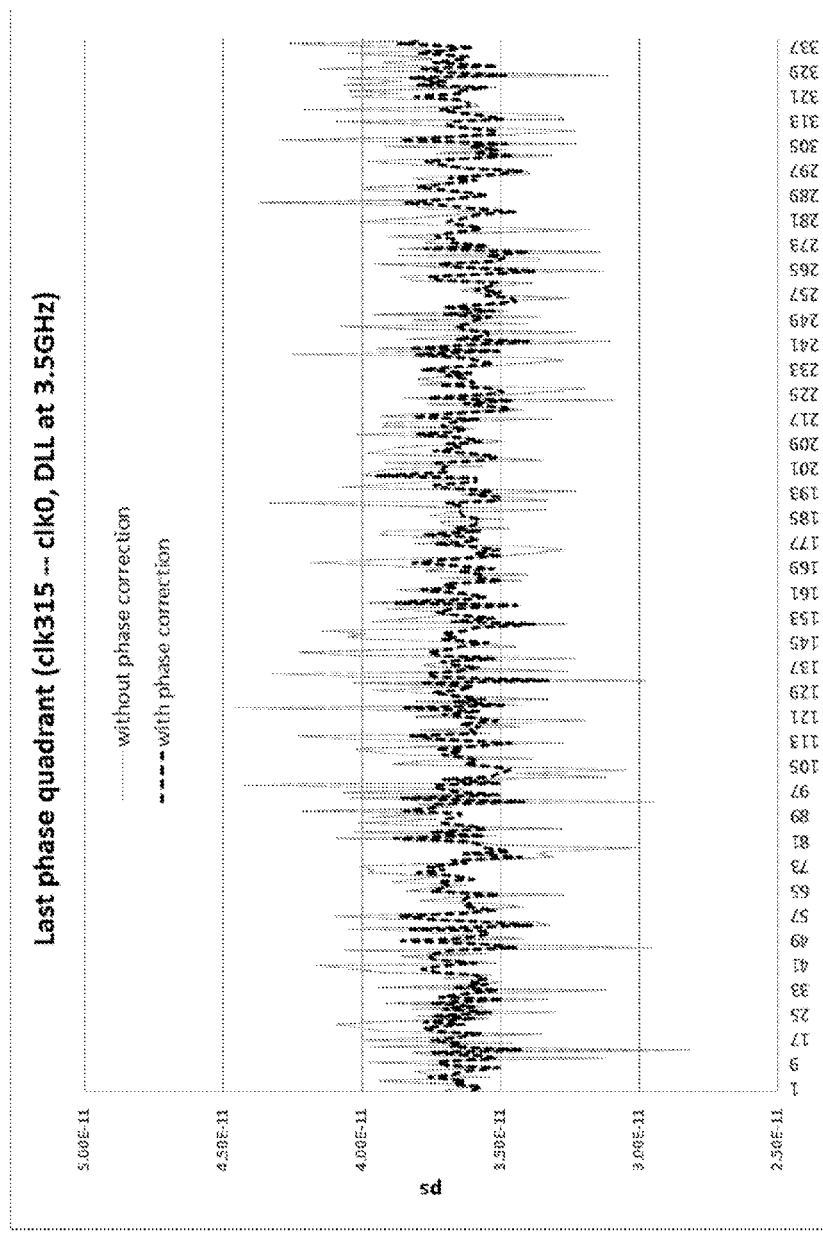
FIG. 5 is a graph illustrating a performance of a DLL system.

It is to be appreciated that the DLL systems according to embodiments of the present invention can provide various advantages over existing DLL systems, both in performance and implementation efficiency. FIG. 5 is a graph illustrating a performance of a DLL system. For example, a random sampling simulation, at 3.5 GHz, using Monte Carlo method shows that undesirable offset caused by the delay module with phase correction (dash line) is much smaller than that of the undesirable offset of delay module without phase correction. The x-axis provides sample number, where over 300 samples are used in the simulation. The y-axis is for the amount of error measured in picoseconds. As can be seen in FIG. 5, the amount of error with correction applied according to embodiments of the present invention is substantially decreased.

Figure 6:
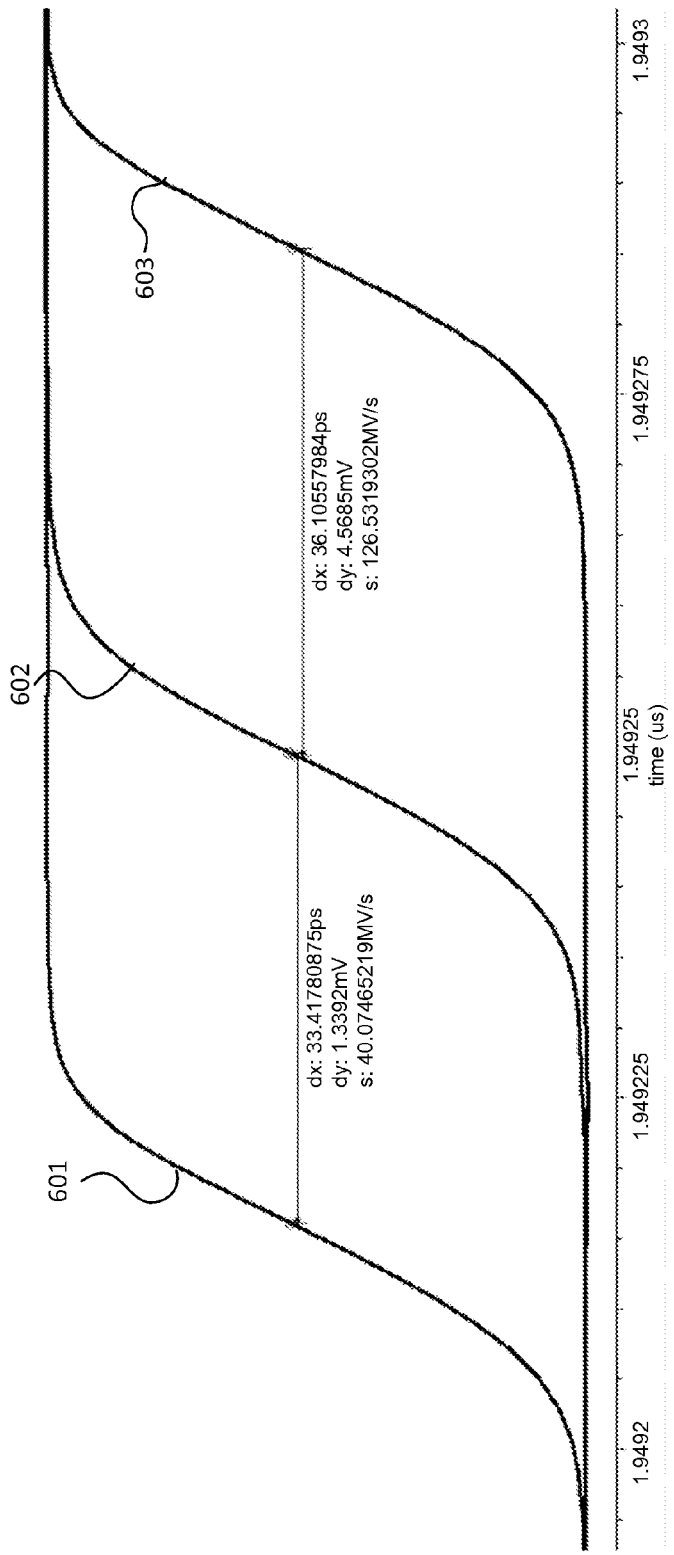
FIG. 6 is a graph illustrating phase error in a DLL system wherein correction is not applied.

FIG. 6 is a graph illustrating phase error in a DLL system wherein correction is not applied. More specifically, the DLL system operates at a frequency of 3.5 GHz and is implemented with 8 phases. Ideally, each phase should be about 1/3.5 GHz/8=35.714 ps. The curve 601 is for phase 8 (i.e., the last phase) in a clock cycle. Curve 602 is for phase 1 (i.e., the first phase). Curve 603 is for phase 2 (i.e., the second phase). Without error correction, the distance between phase 1 and phase 2 as shown is about 36.1 ps, which translates to a phase error of about 36.1-35.714=0.386 ps. As explained above, the phase error cascade within a clock cycle. Therefore, the error between phase 8 and phase 1 is a result of accumulated errors, which is much larger the error between two adjacent phases (e.g., phases 1 and 2). As shown in FIG. 6, the error between phase 8 (from clock cycle n) and phase 1 (from clock cycle n+1) is about 35.714-33.42=2.294 ps. The accumulated error of 2.294 ps is many times greater than the phase error between two adjacent phases.

Figure 7:
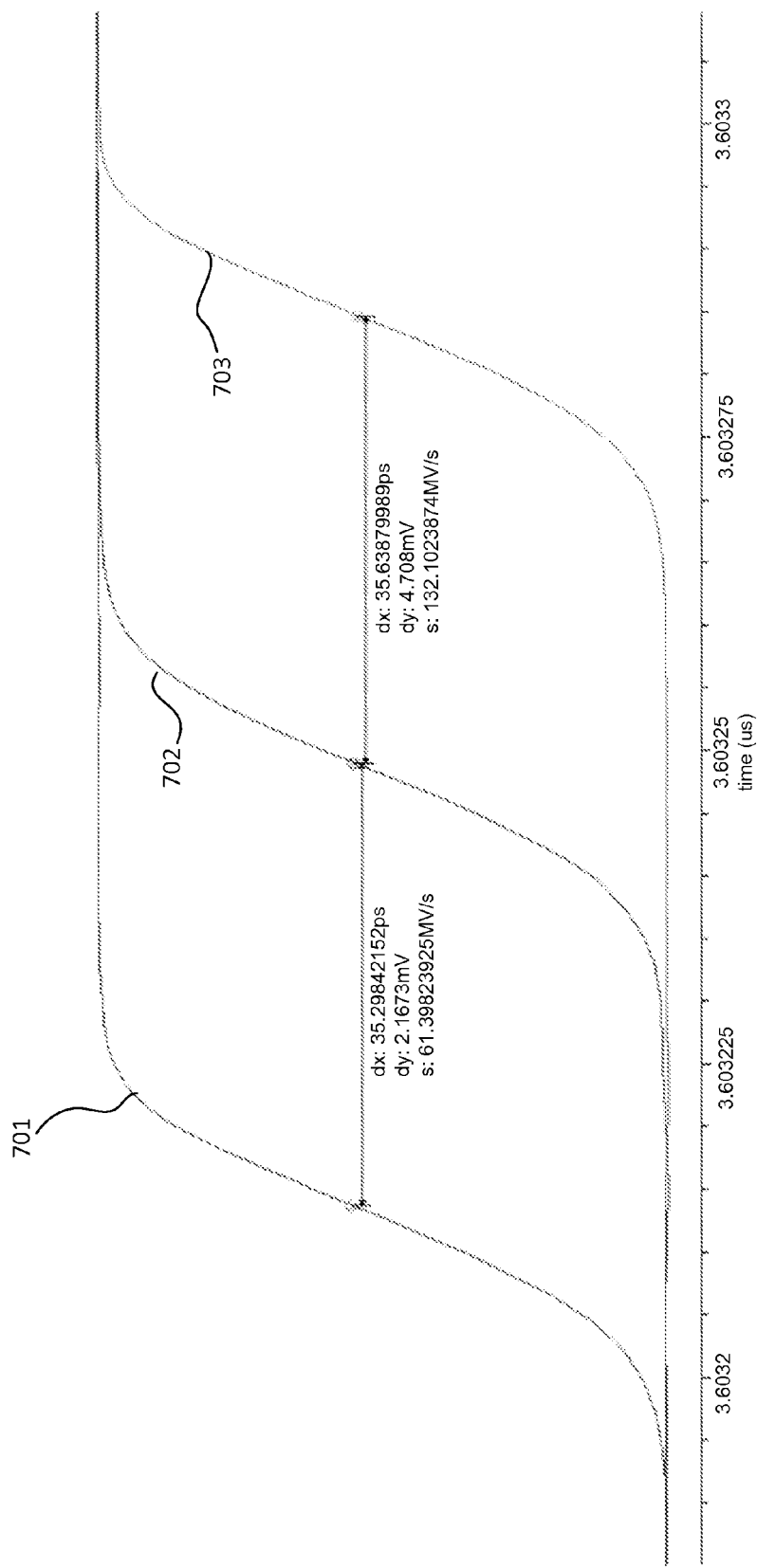
FIG. 7 is a graph illustrating phase error in a DLL system wherein correction is applied according to embodiments of the present invention.

FIG. 7 is a graph illustrating phase error in a DLL system wherein correction is applied according to embodiments of the present invention. The underlying DLL system for FIG. 7 operates at a frequency of 3.5 GHz and is implemented with 8 phases. Ideally, each phase should be about 1/3.5 GHz/8=35.714 ps. The curve 701 is for phase 8 (i.e., the last phase) in a clock cycle. Curve 702 is for phase 1 (i.e., the first phase). Curve 703 is for phase 2 (i.e., the second phase). With error correction applied according to embodiments of the present invention, the distance between phase 1 and phase 2 as shown is about 35.63 ps, which translates to a phase error of about 35.714-35.63=0.084 ps. The error between phase 8 (from clock cycle n) and phase 1 (from clock cycle n+1) is about 35.714-35.298=0.416 ps. It is to be appreciated that error between adjacent phases and accumulated error are significantly reduced (e.g., 2.294 ps v. 0.416 ps of error).

It is to be appreciated that, the delay compensation for the DLL module can be incorporated into the system in various ways. For example, the delay compensation offset can be injected into the charge pump and/or the voltage regulator (e.g., as shown in FIG. 1, FIG. 4A, and FIG. 4B). In certain implementations, the charge pump in a DLL system is specifically configured to perform offset correction according to the embodiments of the present invention. Embodiments of the present invention can be readily incorporated into existing systems and designs. For example, offset correction mechanisms according to the present invention can provide correction signals that modify the input of the charge pumps in DLL systems, thereby improving system performance. In addition, the offset correction mechanisms according to the present invention can be implemented a component separate from the delay module, the cost of implementation is substantially lower than existing offset correction mechanisms. There are other benefits as well.

Figure 8:
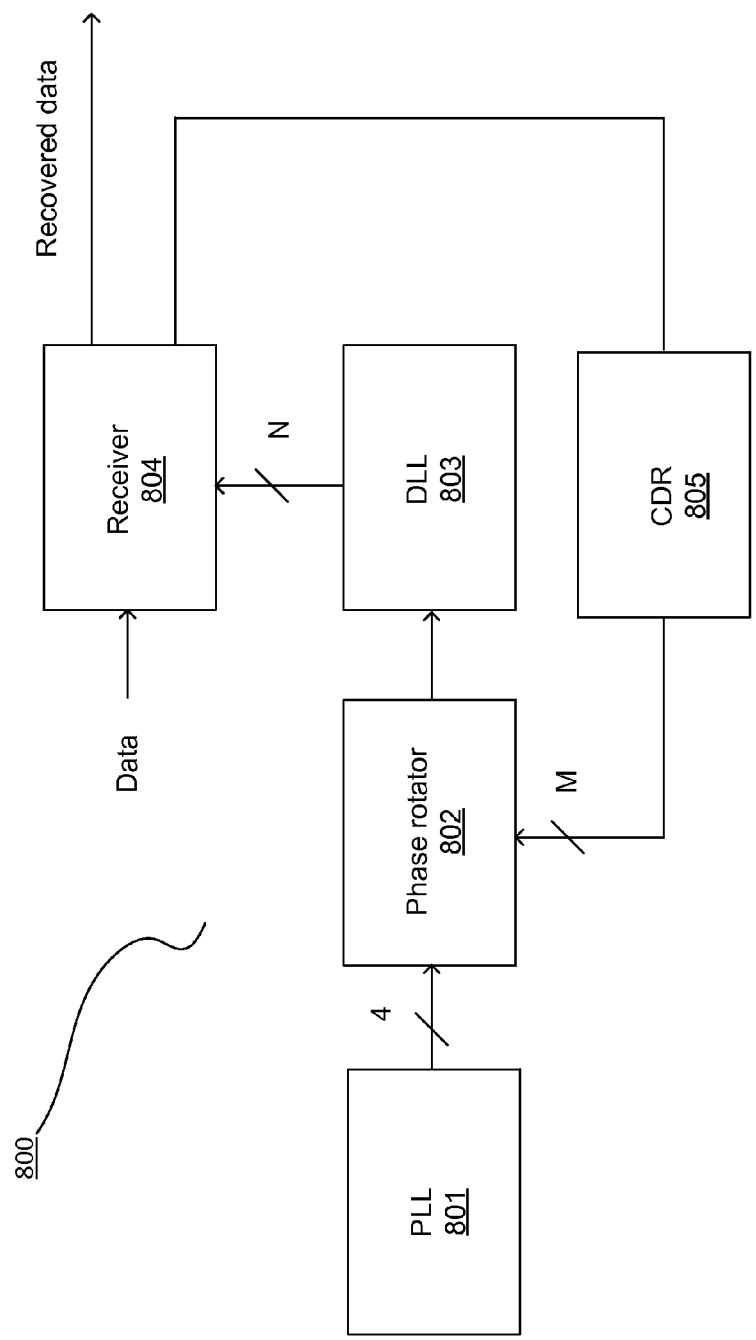
FIG. 8 is a simplified diagram illustrating a SerDes system according to an embodiment of the present invention.

As described above, DLL systems according to embodiments of the present invention can be used in various applications, such as serializer/deserializer (SerDes). FIG. 8 is a simplified diagram illustrating a SerDes system according to an embodiment of the present invention. This diagram is merely an example, which should not unduly limit the scope of the claims. One of ordinary skill in the art would recognize many variations, alternatives, and modifications. The SerDes system 800 includes, among other components, DLL 803. The DLL 803 is connected to the receiver 804 and the phase rotator 802. The DLL 803 enhances clock timing characteristics and works in conjunction with the clock recover (CDR) 805. For example, the DLL 803 is implemented according to embodiments of the present invention as described above, which offers offset compensation for improved performance compared to conventional DLLs. Additionally, the DLL 803 can operate at high speeds.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A delay-lock loop system comprising:
   a phase detector configured to generate an up signal and a down signal based on a reference clock signal and a feedback clock signal;
   a charge pump configured to generate a reference voltage using the up signal and the down signal from the phase detection;
   a voltage regulator configured to generate a drive voltage based on the reference voltage; and
   a delay module having N delay lines, the N delay lines having a first delay line $D_0$ and a last delay line $D_{n-1}$, the delay module being configured to provide a positive current compensation value and a negative current compensation value using a first common feedback structure, the first common feedback structure having a first input based on the phase difference between the first delay line $D_0$ and the last delay line $D_{n-1}$ and a second input based on two adjacent delay lines of the N delay lines.

2. The system of claim 1 wherein the charge pump is associated with a first calibration value.

3. The system of claim 1 wherein the common feedback structure comprises a correction injection module configured to generate an up correction signal and a down correction signal.

4. The system of claim 1 wherein each of the N delay lines is assigned a phase of $2\pi/n$.

5. The system of claim 1 wherein, the N delay lines comprises a second delay line $D_1$, the two adjacent delay lines are the first delay line $D_0$ and the second delay line $D_1$.

6. The system of claim 1 wherein the first common feedback determines a system offset value based on the first input and the second input value.

7. The system of claim 1 wherein the delay module is configured to generate a plurality of specific phase differential signals.

8. The system of claim 1 wherein the charge pump is configured to adjust the reference voltage using the positive current compensation value and/or the negative current compensation value.

9. The system of claim 1 wherein the voltage regulator is configured to adjust the reference voltage using the positive current compensation value and/or the negative current compensation value.

10. The system of claim 1 wherein the delay module is configured to generate N of phase differential signals using the N delay lines.

11. A SerDes system comprising a delay-lock loop system of claim 1.

12. A delay lock loop circuit comprising:
    a phase detector configured to generate an up signal and a down signal based on a first clock signal and a second clock signal;
    a charge pump configured to generate a reference voltage using the up signal and the down signal from the phase detection;
    a voltage regulator configured to generate a drive voltage, the based on the reference voltage;
    a delay module having N delay lines and being configured to process the drive voltage and a reference clock signal, the N delay lines having a first delay line $D_0$, a second delay line $D_1$, and a last delay line $D_{n-1}$, the first delay line being used for providing first clock signal; and
    a correction module configured to determine at least an offset value based on a first difference between the first delay line $D_0$ and the last delay line $D_{n-1}$ and a second difference based on two adjacent delay lines.

13. The circuit of claim 12 wherein the delay module is further being configured to provide the second clock signal.

14. The circuit of claim 12 wherein the correction module is configured to generates an up correction signal and a down correction signal.

15. The circuit of claim 12 wherein the offset value comprises a system offset value.

16. A delay lock loop method comprising:
    receiving a first clock signal and a second clock signal;
    generating an up signal and a down signal using the first clock signal and the second clock signal by a phase detector;
    generating a drive signal by a charge pump;
    generating N delay signals by a delay module having a plurality of delay lines using at least the drive signal, each of the delay signal being associated with a phase of $2\pi/n$, the N delay lines having a first delay line $D_0$ and a last delay line $D_{n-1}$;
    determining a first offset value between the first delay line $D_0$ and a last delay line $D_{n-1}$;
    determining a second offset value between two adjacent delay lines;
    determining a system offset value using the first offset value and the second offset value; and
    modifying the drive signal using the system offset value.

17. The method of claim 16 further comprising generating the first clock signal by the delay module.

18. The method of claim 16 wherein the delay module receives a reference clock signal for generating the N delay signals.

19. The method of claim 16 wherein the two adjacent delay lines includes the first delay line $D_0$ and a second delay line $D_1$.

20. The method of claim 16 wherein an output of the first delay line $D_0$ is used as the first clock signal.

* * * * *